(12) United States Patent
Zhu et al.

(10) Patent No.: US 12,215,865 B2
(45) Date of Patent: Feb. 4, 2025

(54) THERMALLY STABLE THIN-FILM REFLECTIVE COATING AND COATING PROCESS

(71) Applicant: Raytheon Technologies Corporation, Farmington, CT (US)

(72) Inventors: Tianli Zhu, Glastonbury, CT (US); Richard Wesley Jackson, III, Mystic, CT (US); John A. Sharon, West Hartford, CT (US); James T. Beals, West Hartford, CT (US); Brian T. Hazel, Avon, CT (US)

(73) Assignee: RTX Corporation, Farmington, CT (US)

( * ) Notice: Subject to any disclaimer, the term of this patent is extended or adjusted under 35 U.S.C. 154(b) by 26 days.

(21) Appl. No.: 17/714,064

(22) Filed: Apr. 5, 2022

(65) Prior Publication Data
US 2023/0313993 A1 Oct. 5, 2023

(51) Int. Cl.
*F23R 3/00* (2006.01)

(52) U.S. Cl.
CPC .......... *F23R 3/007* (2013.01); *F05D 2230/31* (2013.01); *F05D 2260/231* (2013.01);
(Continued)

(58) Field of Classification Search
CPC ............ F23R 3/007; F23R 2900/00018; F05D 2230/31; F05D 2260/231; F05D 2300/143; F05D 2300/21; F05D 2300/504; F05D 2300/608; F05D 2300/611; F05D 2230/90; C23C 4/134; C23C 4/18; C23C 16/06; C23C 16/30; C23C 16/45529; C23C 28/04; C23C 28/042; C23C 28/32; C23C 28/321; C23C 28/3215; C23C 28/345;
(Continued)

(56) References Cited

U.S. PATENT DOCUMENTS

| 5,998,003 A | 12/1999 | Courtright et al. |
| 6,925,811 B2 | 8/2005 | Ackerman et al. |

(Continued)

FOREIGN PATENT DOCUMENTS

| EP | 1273680 A2 | 1/2003 |
| EP | 3748031 A1 | 12/2020 |
| EP | 3782806 A1 | 2/2021 |

OTHER PUBLICATIONS

Extended European search report dated May 19, 2023 for corresponding EP application 23166194.3.

*Primary Examiner* — Anthony M Liang
*Assistant Examiner* — Danny N Kang
(74) *Attorney, Agent, or Firm* — Bachman & LaPointe, P.C.

(57) ABSTRACT

A gas turbine engine component having a substrate; a thermal barrier coating on the substrate having a porous microstructure; and a reflective layer conforming to the porous microstructure of the thermal barrier coating, wherein the reflective layer comprises a conforming nanolaminate defined by alternating layers of platinum group metal materials selected from the group consisting of platinum group metal-based alloys, platinum group metal intermetallic compounds, mixtures of platinum group metal with metal oxides and combinations thereof. A capping layer can be added over the reflective layer. A supporting layer can be added between the reflective layer and the thermal barrier coating. A process is also disclosed.

18 Claims, 5 Drawing Sheets

(52) U.S. Cl.
CPC .... *F05D 2300/143* (2013.01); *F05D 2300/21* (2013.01); *F05D 2300/504* (2013.01); *F05D 2300/608* (2013.01); *F05D 2300/611* (2013.01); *F23R 2900/00018* (2013.01)

(58) Field of Classification Search
CPC ....... C23C 28/3455; C23C 28/42; C23C 4/11; C30B 28/12; C30B 29/22; F01D 5/288; F01D 25/005
See application file for complete search history.

(56) References Cited

U.S. PATENT DOCUMENTS

| | | |
|---|---|---|
| 6,926,496 B2 | 8/2005 | Ackermann et al. |
| 9,677,180 B2 | 6/2017 | Naik et al. |
| 10,253,984 B2 | 4/2019 | Pearson et al. |
| 2005/0158590 A1 | 7/2005 | Li |
| 2018/0016919 A1 | 1/2018 | Staroselsky et al. |

THERMALLY STABLE THIN-FILM REFLECTIVE COATING AND COATING PROCESS

BACKGROUND

The present disclosure relates to a thermally stable thin-film reflective coating over a ceramic coating, and to a coating process. The reflective coating reduces radiation heat transport through the ceramic coating, and is thermally stable.

Gas turbine engines typically include a compressor to pressurize airflow, a combustor to burn a hydrocarbon fuel in the presence of the pressurized air, and a turbine to extract energy from the resultant combustion gases. The combustor and the turbine form a hot section of the engine and components therein often include a thermal barrier coating (TBC).

The thermal insulation provided by the TBC enables hot section components to survive higher operating temperatures, increases component durability, and improves engine durability. Thermal barrier coatings also increase the effectiveness and efficiency of compressor exit air used to cool turbine components. Although surface temperatures of a turbine component may be higher than 2000 F (1093 C), the surface temperature of the overlying ceramic thermal barrier coating can be as much as 300 F (149 C) hotter or more, leading to temperatures that may be higher than 2,300 F (1260 C).

A typical state-of-the-art zirconium oxide-based thermal barrier coating applied by electron beam physical vapor deposition to a nickel-based alloy substrate typically includes a metallic bond layer applied to the surface of the substrate prior to deposition of the coating. With electron beam physical vapor deposition processing, the oxide ceramic of the coating usually acquires a columnar morphology during growth. Yttrium, magnesium, calcium and/or other suitable oxide is typically added to the zirconium oxide to stabilize the tetragonal and/or cubic crystal structure required for coating durability.

At higher-temperature, heat transport through typical ceramic thermal barrier coatings occur via conduction and radiation. The conduction of heat through these materials via phonon transport remains quite low over a wide range of temperature. However, the translucent nature of ceramic materials can allow for significant levels of heat transfer via radiation as the temperature increases. The heat transfer problems associated with thermal radiation are exacerbated in modern aircraft engines because of their high combustor pressures, which maximize the production of efficiently radiating carbon particulates, and their high peak combustion temperatures. Thermal radiation can contribute as much or even more to overall heat transfer than convective processes in these engines, particularly as temperatures increase.

Reflective coatings can be applied to the ceramic thermal barrier coatings, and these reflective coatings can reduce the surface temperature of the underlying TBC. However, at high temperatures, the reflective coatings can lose stability and thereby lose their ability to protect the underlying TBC.

SUMMARY

A gas turbine engine component as disclosed herein comprises: a substrate; a thermal barrier coating on the substrate having a porous microstructure; and a reflective layer conforming to the porous microstructure of the thermal barrier coating, wherein the reflective layer comprises a conforming nanolaminate defined by alternating layers of platinum group metal materials selected from the group consisting of platinum group metal-based alloys, platinum group metal intermetallic compounds, mixtures of platinum group metal with metal oxide and combinations thereof.

In one non-limiting configuration, the platinum group metal intermetallic compounds are selected from the group consisting of $Pt_3Zr$, $Pt_3Hf$, $Pt_6Ti$, $Pt_3Al$ and combinations thereof.

In another non-limiting configuration, the mixtures of platinum group metal with metal oxide are selected from the group consisting of $Pt-ZrO_2$, $Pt-Al_2O_3$, $Pt-HfO_2$, $Pt-CeO_2$, $Pt-Y_2O_3$, $Pt-La_2O_3$ and combinations thereof.

In a further non-limiting configuration, the reflective layer has a thickness of between 50 and 500 nm.

In a still further non-limiting configuration, the reflective layer has a thickness of between 50 and 200 nm.

Another non limiting embodiment is directed to a gas turbine engine component, comprising: a substrate; a thermal barrier coating on the substrate having a porous microstructure; a reflective layer conforming to the porous microstructure of the thermal barrier coating; and a capping layer on the reflective layer and the thermal barrier coating.

In a non-limiting configuration, the reflective layer comprises reflective platinum group metal.

In another non-limiting configuration, the reflective platinum group metal is selected from the group consisting of platinum group metal-based alloys, platinum group metal intermetallic compounds, mixtures of platinum group metal and metal oxide and combinations thereof.

In a further non-limiting configuration, the platinum group metal-based alloys are selected from the group consisting of Pt—Ir, Pt—Ni, Pt—Ru, Pt—Re, Pt—W, Pt—Co, Pt—Cr, Pt—Mo and combinations thereof.

In a still further non-limiting configuration, the platinum group metal intermetallic compounds are selected from the group consisting of $Pt_3Zr$, $Pt_3Hf$, $Pt_6Ti$, $Pt_3Al$ and combinations thereof.

In another non-limiting configuration, the mixtures of platinum group metal and metal oxide are selected from the group consisting of $Pt-ZrO_2$, $Pt-Al_2O_3$, $Pt-HfO_2$, $Pt-CeO_2$, $Pt-Y_2O_3$, $Pt-La_2O_3$ and combinations thereof.

In still another non-limiting configuration, the reflective layer is a nanolaminate.

In a further non-limiting configuration, the nanolaminate is selected from the group consisting of Pt/Ni/Pt, $Pt/ZrO_2/Pt$, Pt—Ni/Pt—$ZrO_2$, or Pt—Ni/$Pt_3Zr$/Pt—Ni.

In a still further non-limiting configuration, the reflective layer has a thickness of between 50 and 500 nm.

In another non-limiting configuration, the reflective layer has a thickness of between 50 and 200 nm.

In still another non-limiting configuration, the capping layer comprises a high temperature metal oxide.

In a further non-limiting configuration, the high temperature metal oxide is selected from the group consisting of $Al_2O_3$, $HfO_2$, $ZrO_2$, $TiO_2$, $Y_2O_3$, $La_2O_3$, and combinations thereof.

In a still further non-limiting configuration, the high temperature metal oxide is selected from the group consisting of $HfO_2$ and $ZrO_2$ stabilized to tetragonal or cubic phase.

In another non-limiting configuration, the high temperature metal oxide is a transition metal oxide selected from the group consisting of NiO, CoO, FeO, MnO and mixtures thereof.

In still another non-limiting configuration, the capping layer has a thickness of up to 200 nm.

In a further non-limiting configuration, the capping layer has a thickness of between 1 and 50 nm.

In a still further non-limiting configuration, the component further comprises a supporting layer between the thermal barrier coating and the reflective layer.

In another non-limiting configuration, the supporting layer comprises high temperature metal oxides selected from the group consisting of $Al_2O_3$, $HfO_2$, $ZrO_2$, $TiO_2$, $Y_2O_3$, $La_2O_3$, and combinations thereof.

In still another non-limiting configuration, the supporting layer comprises at least one of a single oxide and a nanolaminate structure of different oxides.

In a further non-limiting configuration, the nanolaminate structure of different oxides is selected from the group consisting of $Al_2O_3/ZrO_2/Al_2O_3$, $Al_2O_3/HfO_2/Al_2O_3$, $ZrO_2/Y_2O_3/ZrO_2$, $HfO_2/Y_2O_3/HfO_2$, $HfO_2/PrO_2/HfO_2$, and $HfO_2/ZrO_2/HfO_2$.

In a still further non-limiting configuration, the supporting layer has a thickness of up to 200 nm.

In another non-limiting configuration, the supporting layer has a thickness of between 1 and 50 nm.

Another configuration relates to a process of providing a thermal barrier coating on a turbine engine component, comprising: applying a thermal barrier coating to a substrate, wherein the thermal barrier coating has a porous microstructure; applying a reflective layer conforming to the porous microstructure of the thermal barrier coating, wherein the reflective layer comprises a platinum group metal: and applying a capping layer to the reflective layer.

In still another non-limiting configuration, the step of applying the reflective layer comprises a nano-laminating process.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
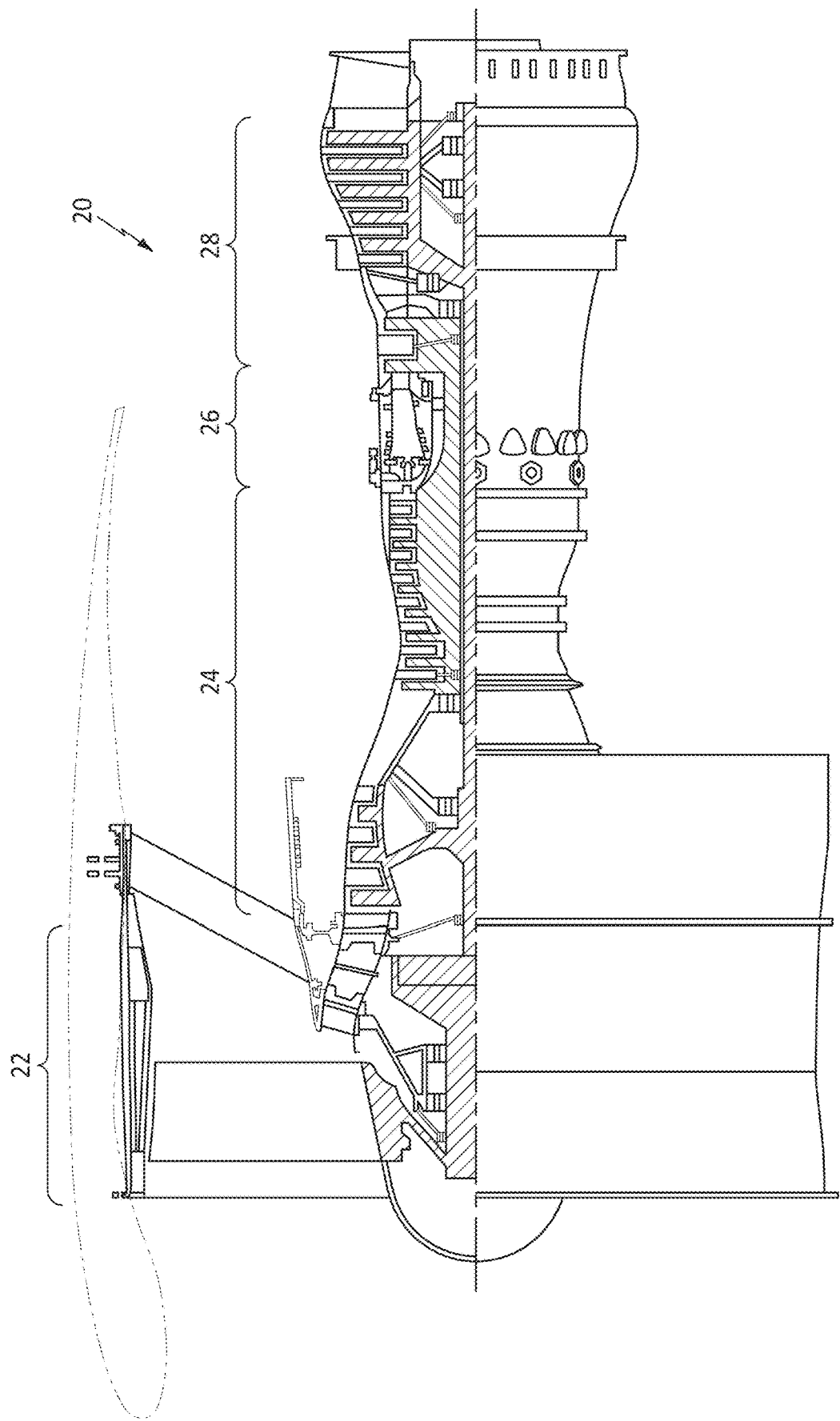
FIG. 1 is a schematic cross-section of an example gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbomachinery to include, but not be limited to, low bypass turbofans, turbojets, turboshafts, three-spool turbofans, industrial gas turbines and numerous other similar engines.

Engine 20 contains numerous components which are exposed to high temperatures during operation, for example temperatures that exceed 2,000 F or even 2,300 F or more. These components are therefore typically coated with a thermal barrier coating, typically a ceramic coating, to allow the component to withstand such temperatures. Further, a reflective layer can be deposited onto or otherwise used to protect the ceramic coating.

Figure 2:
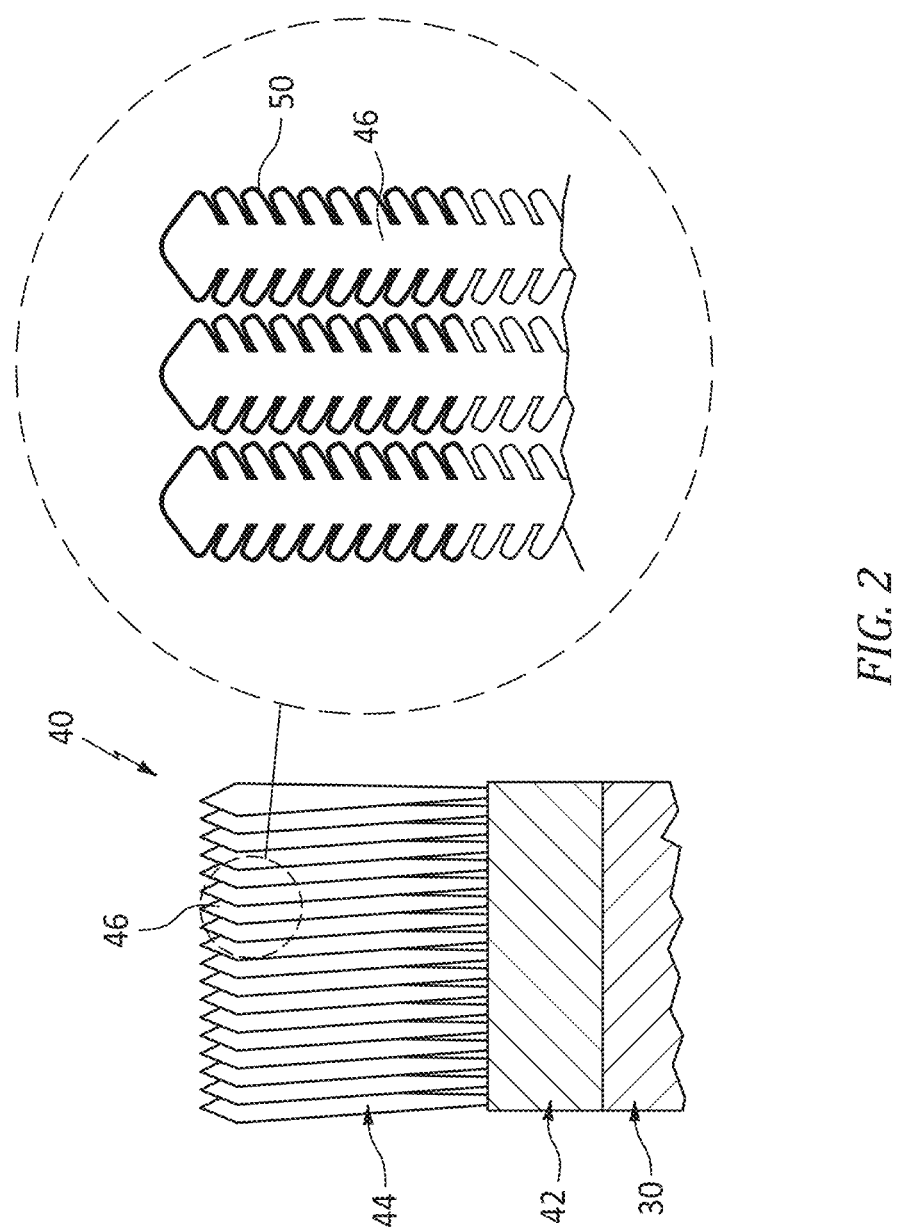
FIG. 2 is a cross-section through a coating system according to one disclosed non-limiting embodiment.

FIG. 2 illustrates a substrate 30, for example a turbine component such as a turbine blade, a combustor, a nozzle and/or a liner, or an aircraft exhaust duct to which a coating system 40 is applied. The coating system 40 is described herein in connection with protection of the substrate 30 such as a superalloy. However, while being described with reference to such superalloy gas turbine engine components, the teachings herein are generally applicable to any component on which a TBC may be used to protect the component from a high temperature environment. Representative component examples of the substrate 30 include but are not limited to combustor section and/or turbine section hardware such as combustor liners, blades, vanes, and blade outer air seals.

The substrate 30 may be formed from any metallic or non-metallic material known in the art. In the context of turbine applications, the substrate 30 may be formed from a nickel-based alloy, an iron-based alloy, or a cobalt-based alloy. The substrate 30 could also be formed from a ceramic material such as a zirconia based ceramic, an alumina based ceramic, a magnesia based ceramic, a ceramic composite or a refractory material.

Coating system 40 can include a metallic bond coat 42 typically formed on the substrate 30 prior to the application of a protective ceramic coating 44. The bond coat 42 may be any suitable bond coat, such as a platinum-aluminide or diffusion aluminide coating or a MCrAlY type coating. The bond coat 42 may be applied in any manner known in the art. For example, a platinum-aluminum coating may be formed by electrodepositing a layer of platinum, vapor depositing an aluminum layer over the platinum, and thereafter interdiffusing the two layers. A MCrAlY coating may be applied using low-pressure plasma spray, air plasma spray, high velocity oxygen flame deposition, or electron beam physical vapor deposition.

The protective ceramic coating 44 may be a thermal barrier coating such as a yttria-, magnesium-, gadolinia- or calcium-stabilized zirconia coating. The ceramic coating 44 may be formed in any suitable manner, such as by plasma spray techniques or (electron beam physical) vapor deposition, as two non-limiting examples. Coating 44 can be applied to have any desired thickness, such as a thickness in the range of from about 0.002-0.040 inches. The ceramic coating 44 can have a controlled microstructure which controls for porosity and can provide an interconnected porosity. Atmospheric thermal spray method, often referred to as air plasma spray (APS), is composed of fine individual splats of the ceramic material with approximately 10% or greater porosity. The porosity may have an interconnected nature. A version of the APS process has less than 10% total porosity but forms vertical crack features that are generally perpendicular to the metal/ceramic interface and are commonly referred to as dense vertically cracked or segmented (DVC) structures. A thermal spray method may also utilize a suspension powder source, suspension plasma spray (SPS), or a solution precursor source, solution precursor plasma spray (SPPS, which can form vertically cracked or columnar structures with features perpendicular to the metal/ceramic interface. Physical vapor deposition (PVD) deposits the ceramic material by means of condensation from the vapor which forms vertical single crystal columns. Electron beams are one heating source used to evaporate the ceramic material for the PVD process (EB-PVD). The protective ceramic coating 44 represents an EB-PVD processed ceramic coating with a controlled microstructure that includes essentially porous microstructure 46 that can be feather shaped columns under high magnification as shown in the magnified view in FIG. 2.

Unlike metallic materials which are opaque, the translucent nature of ceramics allows for direct heat transfer via radiation over certain wavelengths. The amount of heat transferred through the ceramic via radiation during service at high temperature depends upon the predominant wavelengths of the incident radiation, the optical properties, such as emissivity and absorption coefficient, of the coating material, and the coating thickness. The optical transmittance of a thermal barrier coating comprised of yttria-stabilized zirconia is such that up to 80% of incident radiation in the 1-3 mu wavelength range is transmitted through a 0.002" coating.

The fraction of heat transfer that is radiative versus convective increases as the operating condition temperature increases. Recent modeling may indicate that a metallic turbine blade or vane has a 5% heat transfer via radiation versus convection. An advanced material blade/vane that has a 600 F (316 C) higher surface temperature would have up to 20% radiative heat transfer. It is further assumed that hardware in the combustor with higher gas path temperatures and line of site to the combustion flame may have an even higher radiative heat transfer component. Therefore, protection schemes that address radiation heat transfer can have an increasingly significant impact on part surface temperature.

As previously mentioned, ceramic coatings allow for direct heat transfer via radiation over certain wavelengths. This is due to the translucent nature of the oxide ceramics of the coatings. To reduce such radiation heat transport, conforming reflective layer 50 of a reflective material, for example comprising a platinum group metal (PGM), can be applied onto the ceramic coating 44. Each reflective material conforming reflective layer 50 may be formed from an oxidation resistant material having a melting point higher than the use temperature of the ceramic coating 44. Each conforming reflective layer 50 is applied as a thin conforming layer that enters into the interconnected porosity of the ceramic coating 44. That is, the conforming reflective layer 50 is applied into the depths of the porosity of the ceramic coating 44. Atomic Layer Deposition (ALD) is a process which can be used to apply the conforming reflective layer 50.

In one example, the conforming reflective layer 50 penetrates to a depth of 100 microns or greater into the porous microstructure 46 of the ceramic coating 44 but does not physically make contact with the substrate 30 that is to be insulated. In other words, the conforming reflective layer 50 penetrates to a depth from one-quarter to three-quarters the way down the porous microstructure 46 to the substrate 30. In another embodiment, the conforming reflective layer 50 penetrates to a depth 20 times a depth of a gap opening the porous microstructure. In another embodiment, the conforming reflective layer 50 can have a minimum thickness relative to optical opacity, for example for a PGM material, that can be as small as 80 nm. This thickness has been demonstrated to be optically opaque on an optically polished/flat coupon. Being a metal, this translates to being fully reflective.

Platinum materials are opaque once they reach approximately 1000-2000 angstroms and therefore should not require microns or mils of thickness to be effective reflectors. Such a conformal layer thickness that essentially only coats the porous microstructure 46 will not affect the other functionality of the thermal barrier coating. That is, by using a non-line-of-sight deposition method such as, atomic layer deposition (ALD) coating method, the conforming reflective layer 50 conforms to open porosity and gaps of the thermal barrier coating. The ALD process has proven to obtain thickness upon the high aspect ratio features such as down the feather columns formed by the EB-PVD coating. This is in contrast to prior approaches that incorporated layers that fill the porous microstructure and form a near planar discrete layer. Other deposition methods such as or sol or sol gel based methods with precursor chemicals may alternatively be utilized.

Figure 3:
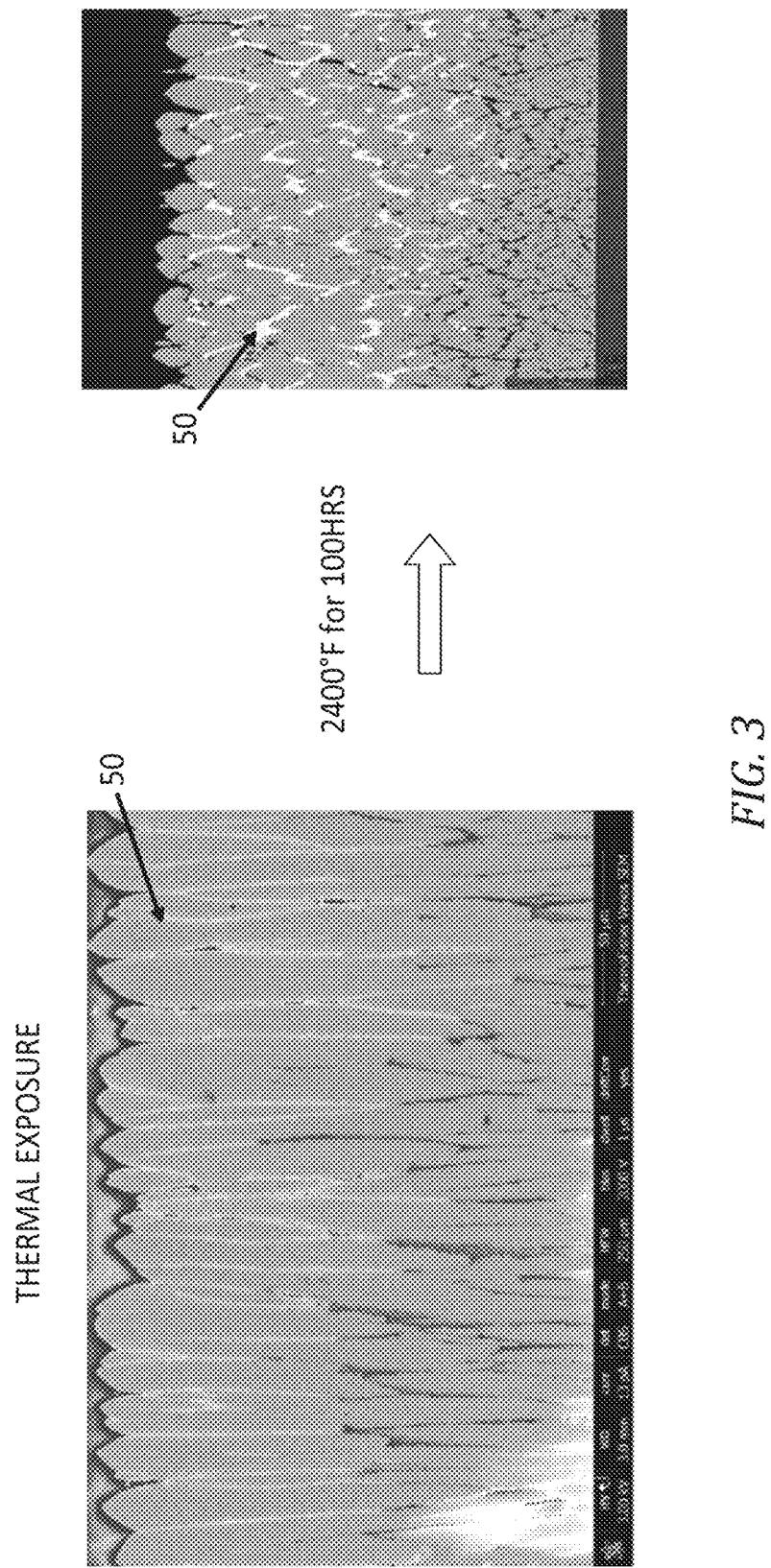
FIG. 3 illustrates migration of reflective layer material after thermal exposure.

As set forth above, platinum group metal (PGM) is particularly useful for forming reflective layer 50 as disclosed herein. It has been found that PGM-based reflective layer 50, when subjected to use at the expected high temperatures, can undergo migration or otherwise lose stability, thereby potentially losing the reflective protection for the underlying TBC. FIG. 3 shows a micrograph of a Pt-based reflective layer coated TBC. The view on the left shows reflective layer 50 covering the TBC as desired, with a substantially uniform coating into the interconnected porosity of the TBC. In the view on the right, after treatment at 2400 F for 100 hours, it can be seen that the reflective material of layer 50 has migrated or agglomerated into the depth of the TBC structure, leaving agglomerated sections in some places and no coating in others. Thus, the reflective protection of the reflective layer is compromised or lost. It is believed that this migration is driven by surface diffusion as well as vaporization into Pt gas.

Figure 4:
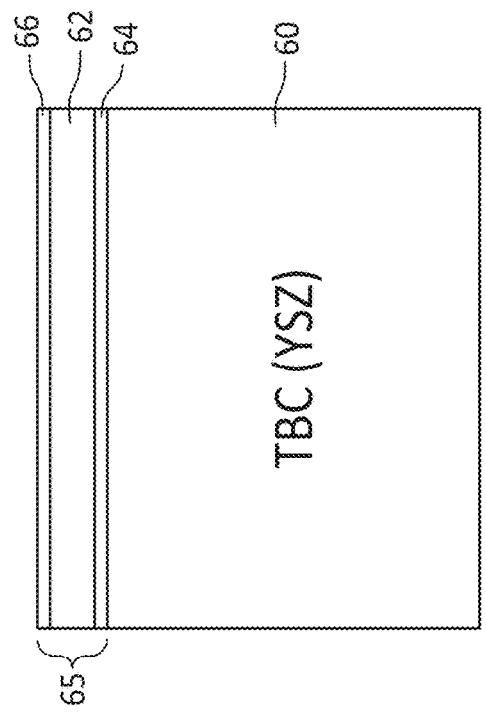
FIG. 4 schematically illustrates a multilayer reflective coating.

FIG. 4 shows a simplified schematic coating system 65 on a thermal barrier coating shown at 60. Coating system 65 has a reflective layer as shown at 62. A supporting layer 64 can be deposited between thermal barrier coating 60 and reflective layer 62. Further, a capping layer 66 can be deposited onto the reflective layer 64. These layers can be repeated in some instances. Each of these layers will be discussed below.

In one embodiment, reflective layer 62 can be formed from a platinum group metal. The platinum group metal can be selected from the group consisting of platinum, palladium, rhodium, iridium, osmium, ruthenium and combinations thereof. These materials can be present as platinum group metal-based alloys, platinum group metal intermetallic compounds, platinum group metal mixed with oxides and combinations thereof. In one non-limiting embodiment, the platinum group metal-based alloys can be selected from the group consisting of Pt—Ir, Pt—Ni, Pt—Ru, Pt—Re, Pt—W, Pt—Co, Pt—Cr, Pt—Mo and combinations thereof. In one non-limiting embodiment, the platinum group metal intermetallic compounds can be selected from the group consisting of $Pt_3Zr$, $Pt_3Hf$, $Pt_6Ti$, $Pt_3Al$ and combinations thereof. Other intermetallic Pt compounds with high melting points, for example greater than 2,700 F, can also be utilized. In one non-limiting embodiment, the mixtures of platinum group metal and metal oxide can be selected from the group consisting of $Pt—ZrO_2$, $Pt—Al_2O_3$, $Pt—HfO_2$, $Pt—CeO_2$, $Pt—Y_2O_3$, $Pt—La_2O_3$ and combinations thereof.

Reflective layer 50 can be applied in any known manner that can result in the desired position and thickness of the layer. In one non-limiting application method, the reflective layer can be co-deposited to obtain an alloy of platinum group metal. In another method, the reflective layer can be co-deposited to produce a platinum group metal intermetallic compound. For example, Pt and Zr can be co-deposited to form $Pt_3Zr$.

Alternatively, the reflective layer can be applied using a nano-laminating approach, for example to form a nanolaminate selected from any of the described PGM materials, that is, platinum group metal alloy, platinum group metal intermetallic, and mixtures of platinum group metal and metal oxide, and combinations thereof. As a further non-limiting example, the reflective layer applied in this manner can be nano-laminated layers such as Pt/Ni/Pt, $Pt/ZrO_2/Pt$, $Pt—Ni/Pt—ZrO_2$, or $Pt—Ni/Pt_3Zr/Pt—Ni$.

When depositing materials with the ALD deposition process, it can be challenging to co-deposit two or more materials at a time. Thus, while various application methods can be used within the broad scope of this disclosure, one well-suited approach is to make the reflective coating by means of the nano-laminate approach as discussed above. As a further non-limiting example, for Pt—Ir, instead of a depositing a homogenous alloy, alternating layers of Pt and Ir can be deposited such that the average composition would be the desired Pt—Ir alloy. Further, during operation at high temperature, these nano-laminate layers may interact and homogenize, at least partially, to the intended alloy. Thus, application of the intended reflective layer materials can advantageously be done through a nano-laminate approach.

Platinum group metals are well suited to use in the reflective layer of this disclosure because they are resistant to oxidation in a turbine environment. As a result, they will retain the desired reflective properties during service. Further, these materials possess a melting point in excess of the ceramic coating operating conditions.

The various forms discussed above with respect to the platinum group metal can help the reflective material resist agglomeration when exposed to high temperatures by increasing the melting temperature of the material in the coating, reducing reactivity of the reflective material, and potentially other mechanisms.

As set forth above, reflective layer 62 can be applied using numerous techniques, but ALD is particularly suitable as it creates a layer or coating that conforms to the underlying structure, and that can be very thin. This helps to provide the desired reflectivity without significant extra weight or materials cost, and without significantly interfering with the other protective mechanisms of the TBC. Further, ALD deposition can be used to produce nano-laminate structures of the various PGM based materials as discussed above.

Nano-laminating refers to application of nm thickness layers to a substrate in successive fashion such that the resulting layers are in intimate contact with each other. The resulting nanolaminate is a fully dense, ultra-fine-grained solid exhibiting a high concentration of interface defects. A nanolaminate generally consists of different compositions in layers. For example, a $Pt/Al_2O_3$ nanolaminate may have a thin layer of Pt follow by a thin layer of $Al_2O_3$ and then a thin layer of Pt, and so on, until the desired overall thickness is reached. In the field of ALD application, a nanolaminate can be a film comprised of 2 or more different chemistries whose individual layer thicknesses are nano in scale and the sequence repeats itself several times. In the example of platinum and alumina, the platinum layer can be 50 nm thick and the alumina layer 10 nm thick, as one non-limiting example. Within the dense nanolaminate, each layer can be ultrafine grain or amorphous.

The reflective layer can have a thickness of between 50 and 500 nm. The lower limit is selected to provide at least some level of opacity, while the upper limit is selected to avoid interfering with the other properties of the coating, and 500 nm is also about half of the thickness of the standard opening between columns of the TBC coating. Within this broad range, in a further non-limiting configuration, the reflective layer can have a thickness of between 50 and 300 nm, or in a further non-limiting configuration, between 50 and 200 nm. In some configurations, a lower limit of 100 nm may be suitable.

Capping layer 66 can be formed of a high temperature metal oxide, for example an oxide that undergoes no phase change at temperatures between ambient and 2,400 F. The high temperature metal oxide can be selected from the group consisting of $Al_2O_3$, $HfO_2$, $ZrO_2$, $TiO_2$, $Y_2O_3$, $La_2O_3$, and combinations thereof. Further, some materials such as $HfO_2$ and $ZrO_2$ can additionally be stabilized to the tetragonal or cubic phases by one of many stabilizers known to persons of ordinary skill in the art. $Al_2O_3$ can be thermally stablished by different dopants. Further, some transition metal oxides can be suitable, such as NiO, CoO, FeO. MnO or combinations thereof. These oxides have a high emissivity in NIR and can absorb radiation.

The capping layer 66 can be applied using ALD such that very small, conforming, thicknesses can be achieved. For example, capping layer 66 can have a thickness of up to 200 nm. Above this thickness, loss of reflectivity of the reflective layer can become undesirably high, for example about 15%. In one non-limiting embodiment, capping layer 66 can have a thickness of between 1 and 50 nm. Within these ranges of thickness, it should be noted that some oxides can become amorphous when applied in layers at a thickness of less than about 40 nm. Thus, for such oxide layers, when used as the capping layer, this consideration should be kept in mind.

Capping layer 66 can also be applied as a nanolaminate as outlined above with respect to the reflective layer.

Capping layer 66 is believed to help screen the underlying reflective layer from the conditions that lead to instability of the reflective layer. Specifically, capping layer 66 can help to prevent vaporization of the platinum group metal from the reflective coating 62.

As set forth above, in one embodiment the component with coating system can have a supporting layer 64. The supporting layer 64 can be deposited or positioned between the thermal barrier coating 60 and the reflective layer 62.

The supporting layer 64 can comprise high temperature metal oxides, and the same materials discussed above with respect to the capping layer are also useful as the supporting layer 64. This material can in one embodiment be a material that does not exhibit phase change over a temperature range between ambient and 2400 F. The supporting layer can comprise at least one of a single oxide and a nanolaminate structure of different oxides. Thus, in one non-limiting embodiment, the nanolaminate structure of different oxides for the supporting layer can be selected from the group consisting of $Al_2O_3/ZrO_2/Al_2O_3$, $Al_2O_3/HfO_2/Al_2O_3$, $ZrO_2/Y_2O_3/ZrO_2$, $HfO_2/Y_2O_3/HfO_2$, $HfO_2/PrO_2/HfO_2$, and $HfO_2/ZrO_2/HfO_2$.

The supporting layer 64 can have a thickness of up to 200 nm. In one non-limiting embodiment the supporting layer can have a thickness of between 1 and 200 nm, and in some instances between 1 and 50 nm. In some instances the lower limit of these ranges can be 10 nm, and in another non-limiting configuration the thickness can be between 5 and 10 nm.

The supporting layer has been found to bring more stability at high temperature by maintaining the crystalline structure at high temperature. Further, the supporting layer can optimize bonding to the TBC structure. ALD application and bonding can be affected by the composition/type of surface. If the surface to be applied to is not ideal for the material to be deposited, the support layer acts as an intermediate layer to enable deposition and bonding. Ideally, the supporting layer is deposited in a high temperature stable crystalline form so as not to undergo changes when submitted to high temperature that may impact adhesion/durability.

The materials utilized in the reflective layer, the capping layer, and also the optional supporting layer can all combine to provide enhanced stability of the reflective layer as disclosed herein.

Figure 5:
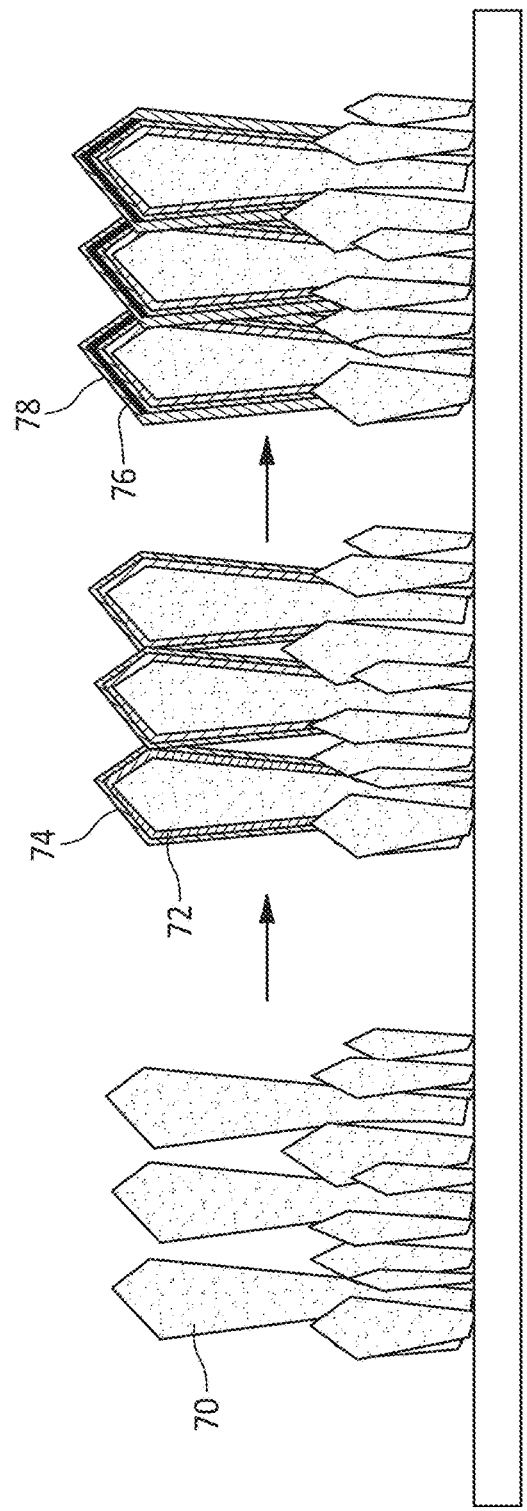
FIG. 5 further schematically illustrates a multilayer reflective coating process.

FIG. 5 schematically illustrates a further configuration wherein a multilayer ALD coating is applied over the surface of TBC columns. In FIG. 5, the left view shows TBC columns 70 before ALD coating. In the middle view of FIG. 5, two layers 72, 74 have been applied. These layers, depending upon the coating structure being applied, could be a supporting layer applied to the columns 70, and a reflective layer applied to the supporting layer. In the right view of FIG. 5, repeating layers 76, 78 have been applied, and it should be noted that as represented herein supporting, reflective and/or capping layers can be repeated, and/or specific layers can be repeated. Thus, in FIG. 5, layers 76, 78 could be a repeated reflective layer followed by a capping layer, each as discussed above. In this configuration, layers 74 and 76 would both be reflective layers, and these could be applied through co-deposition, nanolamination or any other layer structure as desired.

It should be appreciated from a consideration of the right view of FIG. 5 that the coating and/or coating system as disclosed herein has coating primarily located on interior surfaces of the TBC being coated. This positioning of the coating helps to provide the advantages of a reflective coating while keeping the reflective coating stable and therefore functional for an extended lifetime. The coating as shown in FIG. 5 can be evaluated by the ratio of coating volume on interior surfaces of the TBC to coating volume on outer surfaces. Interior surfaces as considered herein can be surfaces which face other surfaces within the crystalline structure of the TBC, while outer surfaces can be surfaces that face outwardly, and not toward other crystalline structures of the coating. In one embodiment, the ratio of the volume of reflective coating on the interior of the coating to the outer surface of the coating should be greater than 10:1 and in some embodiments can be greater than 20:1.

Figure 6:
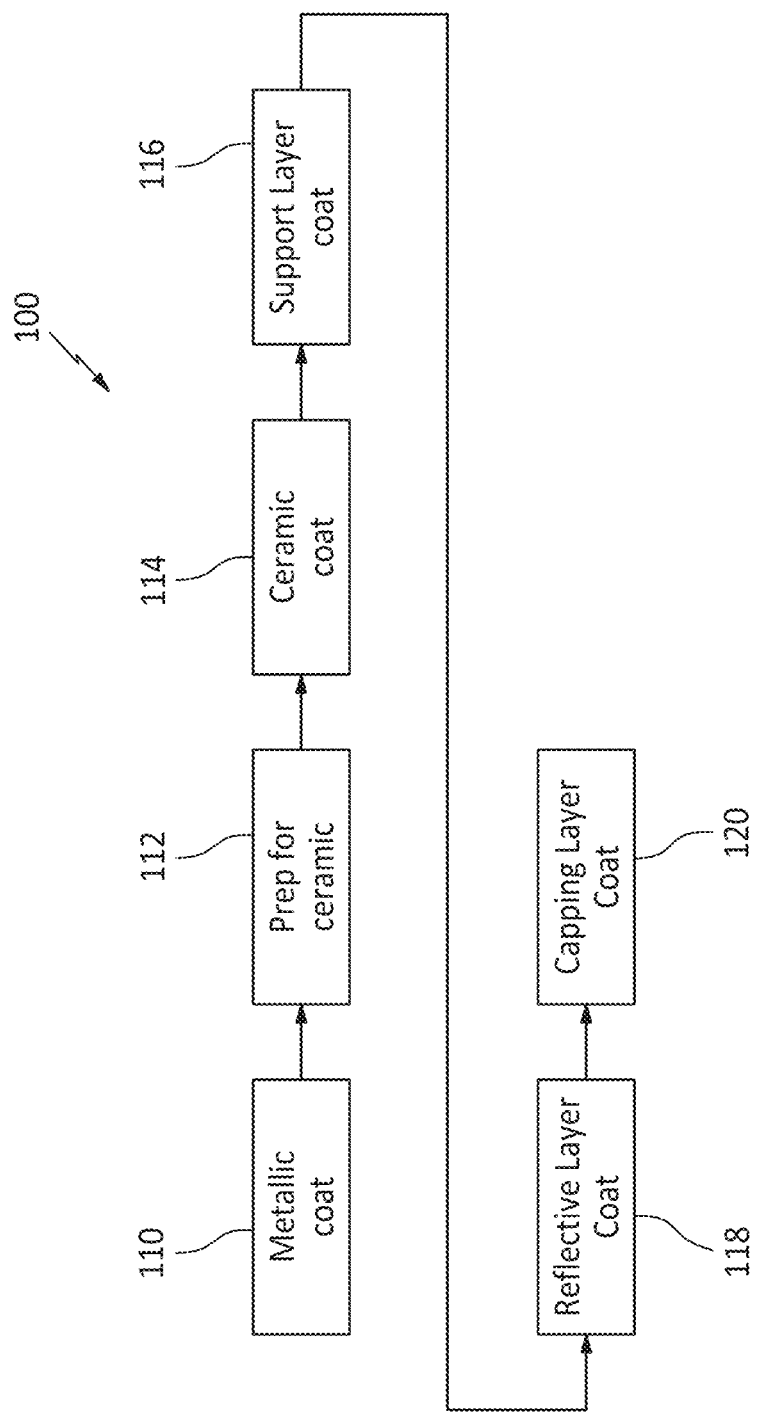
FIG. 6 is a flowchart of a process according to one disclosed non-limiting embodiment for application of a coating system to a component.

With reference to FIG. 6, a process 100 to form the coating system as disclosed herein onto a substrate is illustrated. The steps of the process 100 are schematically disclosed in terms of functional block diagrams as a flow-chart. It should be appreciated that alternative or addition steps may be provided without departing from the teaching herein.

Initially, an optional metallic bond coat can be applied to the underlying component (step 110). The metallic bond coat can provide for environmental protection against oxidation corrosion and forms a bonding layer to the ceramic. Typically, an MCrAlY metallic bond coat can be applied via a low pressure plasma spray or other PVD method. The metallic bond coat may be from about 50 to several hundred microns of thickness.

Once the metallic bond coat is applied, the surface is prepared for the ceramic (step 112). In one example, the preparation may include baking the component via an air furnace at temperatures of about 1000 F to burn off organics and other impurities such as machine oils, etc. The surface may also be prepared by mechanical processes such as grit blast to provide a controlled surface finish.

Next, the ceramic coating or TBC can be applied (step 114), for example by electron beam physical vapor deposition, and this grows a porous microstructure. The ceramic coating may also be applied by atmospheric thermal spray as a porous layer or a layer with vertically segmented cracks/gaps, or by suspension or solution precursor thermal spray with vertical porous microstructure to form the porous microstructure. In one example the ceramic coating 44 may be of a thickness from 100 microns to several hundreds of microns depending on the application. Two current ceramics include yttria stabilized zirconia or gadolinium zirconate, but other ceramics are also possible.

Once the ceramic coating is applied, the surface can be again optionally prepared for the next step. In one example, the preparation may again include thermal exposure to burn off deleterious organics, but not mechanical treatment so as to avoid anything which may damage the surface of the ceramic coating.

In step 116, an optional supporting layer or coat can be applied as discussed above.

Next, the conforming reflective layer can be applied via, for example, atomic layer deposition (step 118). It may be desirable to place the conforming reflective layer 50 as close as possible to the hot side of the coated article, i.e. the exposed surface of the coating, to achieve the maximum benefit in terms of cooling the substrate.

Next, in step 120, a capping layer or coat can be applied over the reflective layer. This capping layer can encapsulate the reflective layer and this encapsulation helps to prevent the agglomeration of reflective metal in the reflective layer.

Finally, an optional post coat processing step (not shown) can be performed such as cleanup operations, masking removal, burnishing, polishing, pencil grit blasting, etc.

As discussed above, the conforming reflective layer as disclosed herein provides a conforming layer to the TBC, so the reflective layer is not just at the surface of the TBC as a simple overcoat, but is a thin conforming layer to the underlying microstructure. The conforming reflective layer requires only a minimal amount of material that forms a reflective surface. The conforming nature does not impact the strain tolerance and the functionality of the inherent ceramic coating as the columns of the ceramic coating are not tied together.

The use of the terms "a" and "an" and "the" and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to the normal operational attitude of the vehicle and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit from the subject matter disclosed herein.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed:

1. A gas turbine engine component, comprising:
   a substrate;
   a thermal barrier coating on the substrate having a porous microstructure;
   a reflective layer conforming to the porous microstructure of the thermal barrier coating, wherein the reflective layer comprises a reflective platinum group metal selected from the group consisting of platinum group metal intermetallic compounds; and
   a capping layer on the reflective layer and the thermal barrier coating.

2. The component of claim 1, wherein the platinum group metal intermetallic compounds are selected from the group consisting of $Pt_3Zr$, $Pt_3Hf$, $Pt_6Ti$, $Pt_3Al$ and combinations thereof.

3. The component of claim 1, wherein the reflective layer is a nanolaminate.

4. The component of claim 3, wherein the nanolaminate is selected from the group consisting of Pt/Ni/Pt, Pt/$ZrO_2$/Pt, Pt—Ni/Pt—$ZrO_2$, or Pt—Ni/$Pt_3Zr$/Pt—Ni.

5. The component of claim 1, wherein the reflective layer has a thickness of between 50 and 500 nm.

6. The component of claim 1, wherein the reflective layer has a thickness of between 50 and 200 nm.

7. The component of claim 1, wherein the capping layer comprises a high temperature metal oxide.

8. The component of claim 7, wherein the high temperature metal oxide is selected from the group consisting of $Al_2O_3$, $HfO_2$, $ZrO_2$, $TiO_2$, $Y_2O_3$, $La_2O_3$, and combinations thereof.

9. The component of claim 8, wherein the high temperature metal oxide is selected from the group consisting of $HfO_2$ and $ZrO_2$ stabilized to tetragonal or cubic phase.

10. The component of claim 7, wherein the high temperature metal oxide is a transition metal oxide selected from the group consisting of Nio, CoO, FeO, MnO and mixtures thereof.

11. The component of claim 1, wherein the capping layer has a thickness of up to 200 nm.

12. The component of claim 1, wherein the capping layer has a thickness of between 1 and 50 nm.

13. The component of claim 1, further comprising a supporting layer between the thermal barrier coating and the reflective layer.

14. The component of claim 13, wherein the supporting layer comprises high temperature metal oxides selected from the group consisting of $Al_2O_3$, $HfO_2$, $ZrO_2$, $TiO_2$, $Y_2O_3$, $La_2O_3$, and combinations thereof.

15. The component of claim 13, wherein the supporting layer comprises at least one of a single oxide and a nanolaminate structure of different oxides.

16. The component of claim 15, wherein the nanolaminate structure of different oxides is selected from the group consisting of $Al_2O_3$/$ZrO_2$/$Al_2O_3$, $Al_2O_3$/$HfO_2$/$Al_2O_3$, $ZrO_2$/$Y_2O_3$/$ZrO_2$, $HfO_2$/$Y_2O_3$/$HfO_2$, $HfO_2$/$PrO_2$/$HfO_2$, and $HfO_2$/$ZrO_2$/$HfO_2$.

17. The component of claim 13, wherein the supporting layer has a thickness of up to 200 nm.

18. The component of claim 13, wherein the supporting layer has a thickness of between 1 and 50 nm.

* * * * *